(12) United States Patent
Clarke et al.

(10) Patent No.: US 6,309,295 B1
(45) Date of Patent: Oct. 30, 2001

(54) ELECTRONIC EQUIPMENT SHELF WITH BLANK FOR UNEQUIPPED POSITION

(75) Inventors: John Edward Clarke, Colts Neck; Naresh C. Patel, Howell, both of NJ (US)

(73) Assignee: Lucent Technologies Inc., Murray Hill, NJ (US)

(*) Notice: Subject to any disclaimer, the term of this patent is extended or adjusted under 35 U.S.C. 154(b) by 0 days.

(21) Appl. No.: 09/249,692

(22) Filed: Feb. 12, 1999

(51) Int. Cl.[7] .......................................... H05K 7/20
(52) U.S. Cl. ............................... 454/184; 361/695
(58) Field of Search ............................... 454/184; 361/695

(56) References Cited

U.S. PATENT DOCUMENTS

| | | | |
|---|---|---|---|
| 4,620,265 | 10/1986 | Lerude et al. | 361/424 |
| 4,659,349 | * 4/1987 | Rodi et al. | 454/184 X |
| 5,361,188 | * 11/1994 | Kondou et al. | 361/695 |
| 5,544,012 | * 8/1996 | Koike | 454/184 X |
| 5,563,768 | * 10/1996 | Perdue | 261/695 |
| 5,707,282 | 1/1998 | Clements et al. | 454/184 |

FOREIGN PATENT DOCUMENTS

WO 98/21922    5/1998    (WO) .............................. H05K/7/20

OTHER PUBLICATIONS

D. Flockton, "It's all in the packaging", *Mechanical Engineering*, Feb. 1999, pp. 58–59.

* cited by examiner

Primary Examiner—Harold Joyce
(74) Attorney, Agent, or Firm—Thomas J. Bean; Gregory J. Murgia

(57) ABSTRACT

A circuit pack blank occupies an unequipped position in an electronic equipment shelf that is cooled by forced-air convection. The blank incorporates two diffuser blades that protrude into a cooling space in the shelf adjacent to the blank. When air is forced through the cooling space at a constant velocity, a backpressure is generated that is equivalent to backpressures generated at cooling spaces adjacent to equipped positions. In addition, the blank has a faceplate that incorporates one or more cable trays used to retain cables at the unequipped position for future use.

16 Claims, 5 Drawing Sheets

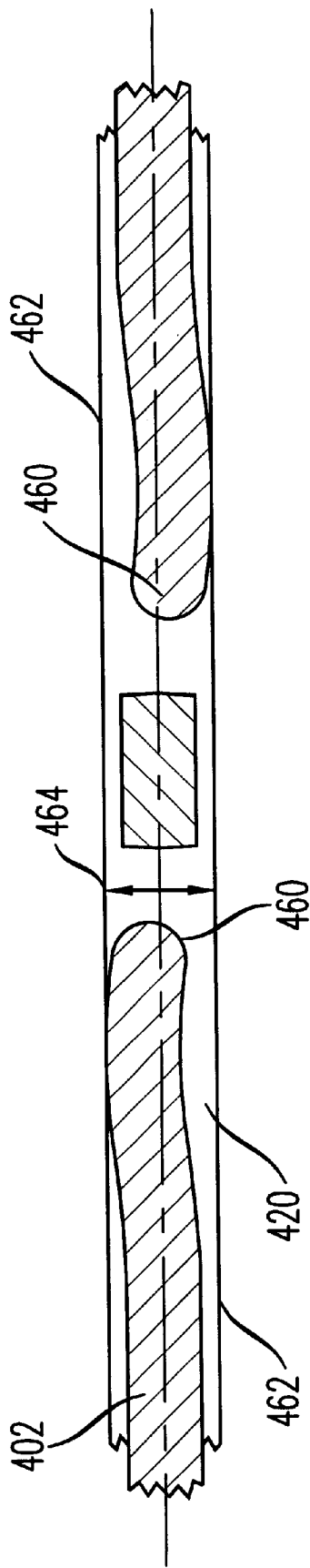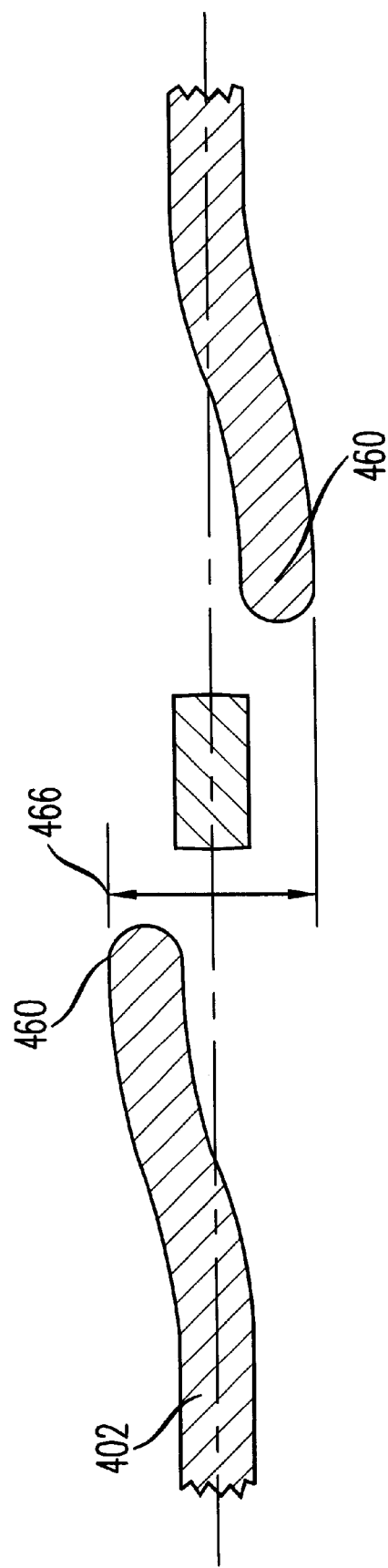

ELECTRONIC EQUIPMENT SHELF WITH BLANK FOR UNEQUIPPED POSITION

FIELD OF THE INVENTION

This invention relates to the packaging of electronic apparatus in an equipment shelf. More particularly, the invention relates to the use of a blank in an unequipped shelf position to equalize airflow back pressure in the shelf, and to retain optical cables provided for future use at the unequipped position.

BACKGROUND OF THE INVENTION

Complex electronic apparatus may require the interconnection of thousands of individual electronic devices. To manage the large number of required interconnections, such apparatus is often configured by affixing devices to a circuit boards (circuit packs), and by interconnecting these circuit packs via one or more printed wire backplanes. Collections of interconnected circuit packs are often contained in housings referred to as equipment shelves.

As circuit and power densities increase, heat dissipation presents a significant challenge. Increasingly, forced air convective cooling is used in equipment shelves to provide the required cooling capacity. In a typical shelf configuration, circuit packs are positioned vertically with sufficient spacing to allow for airflow between adjacent packs. Airflow is generated by fans located above or below the shelf, and directed past the packs by enclosing the sides, rear and front of the shelf to be relatively airtight. Air flowing past the boards carries heat away from the electronic devices on the boards, and is then exhausted from the shelf. Ambient air is drawn into the shelf by the fans to refresh and continue the airflow.

The effectiveness of this approach can be impacted by imbalances in the equipment shelf. For example, to allow for future increases in system capacity, fewer than all circuit pack positions may be equipped. Fan assemblies for shelves that are partially equipped may generate uneven airflow backpressures across the equipped and unequipped positions.

In an equipped position, electronic devices are present in the airflow path, and these devices create resistance and an associated pressure drop over the airflow path. In an unequipped position, no electronic devices sit in the airflow path, and pressure differentials over the path are substantially less. Because air moving through the shelf seeks a path of least resistance, the presence of unequipped positions leads to an increased airflow through the unequipped positions and a decreased airflow through the equipped positions. While fans with increased capacity can substantially overcome this problem, they may also generate increased noise, require added space, consume additional power, generate additional cost, and experience reduced life. In addition, fan failures may occur, increasing the risks of overheating and reducing the life of the electronic devices.

SUMMARY OF THE INVENTION

Uniform airflow backpressure is substantially maintained across airflow paths in partially-equipped equipment shelves through use of a novel circuit pack blank for unequipped positions. Each blank includes a base for retaining the blank in an unequipped position, and one or more diffuser blades attached to the base to create resistance in an adjacent air plenum. The diffuser blade is designed to generate a backpressure in the adjacent air plenum that is substantially equivalent to backpressures generated in air plenums adjacent to the equipped positions.

In a preferred embodiment of the blank, two diffuser blades are attached to the base to provide resistance both at the entrance and exit of the adjacent airflow path. In addition, the blank incorporates a faceplate that supports insertion and removal, and that contains a novel tray for retaining associated cables in position for future use. In a preferred embodiment of the shelf, the blank is inserted into an unequipped position in the shelf via an apparatus guide, and positioned so that an air plenum is formed between the blank and an adjacent equipped position. The diffuser blades attached to the blank effectively reduce the cross-sectional area of this air plenum, so that a backpressure generated by air flow in the air plenum is substantially equivalent to a backpressure generated by air flow in an air plenum adjacent to the equipped position.

BRIEF DESCRIPTION OF THE DRAWING

A more complete understanding of the invention may be obtained by reading the following description of specific illustrative embodiments of the invention in conjunction with the appended drawing in which:

FIGS. 4A and 4B depict a spring mechanism as illustrated in the base of FIG. 1 for reducing vibration in the base.

Figure 1:
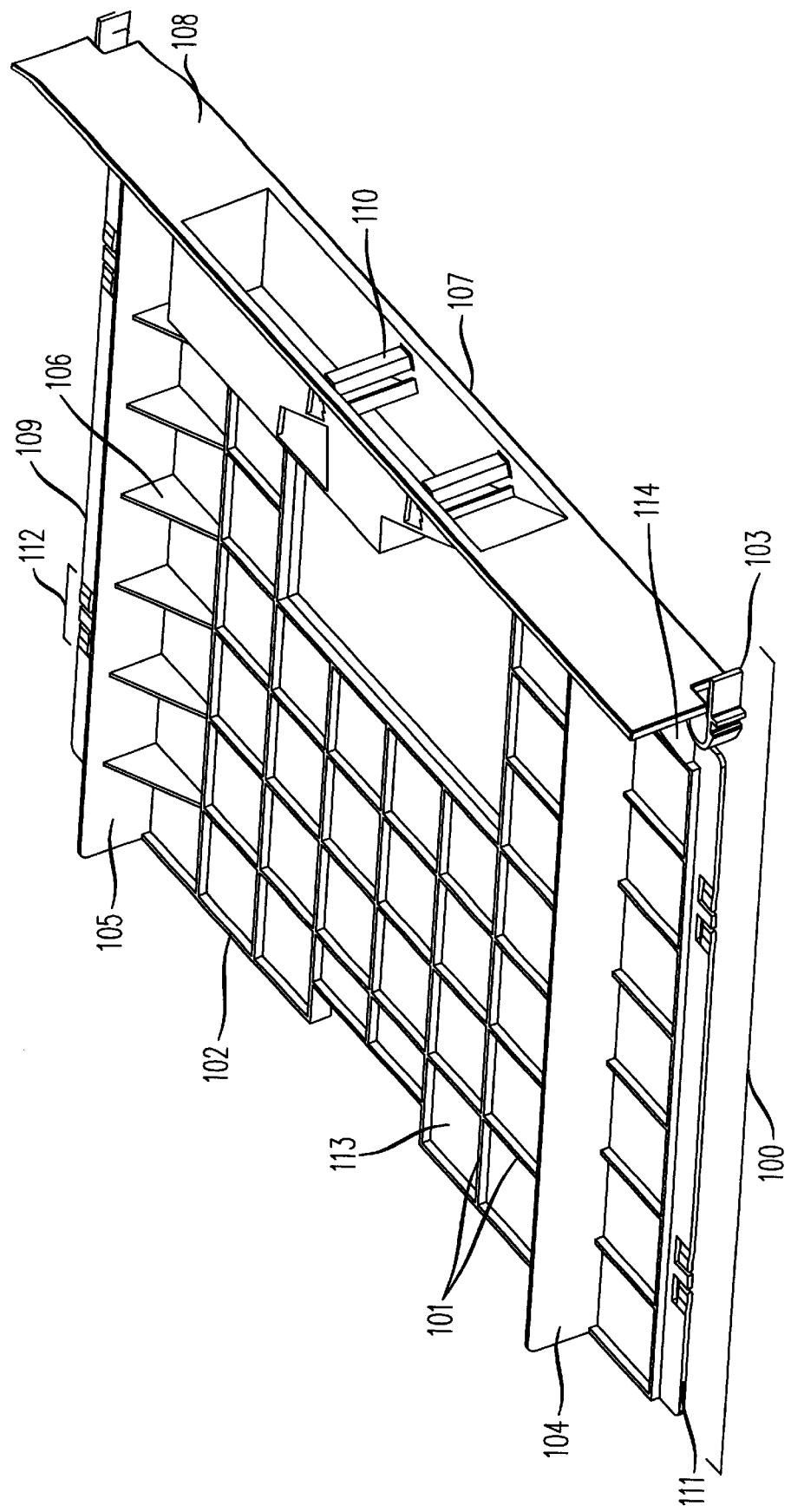
FIG. 1 illustrates a preferred embodiment of the circuit pack blank, which includes a base, two diffuser blades, a faceplate and a cable tray.

For consistency and ease of understanding, those elements of each figure that are similar or equivalent share identification numbers that are identical in the two least significant digit positions (for example, diffuser blade 104 of FIG. 1 is equivalent to diffuser blade 204 of FIG. 2).

DETAILED DESCRIPTION

An illustrative embodiment of the circuit pack apparatus blank 100 is shown in FIG. 1. The blank 100 includes a diffuser blade 104 that is perpendicularly attached to a base 102, in such manner that it faces a lower edge 111. In addition, the blank includes a diffuser blade 105 perpendicularly attached to base 102, in such manner that it faces an upper edge 109. When inserted into an unequipped position in an equipment shelf, diffuser blades 104 and 105 serve to reduce the effective cross-sectional area of an airflow path over the blank 100, and thereby generate an increased airflow backpressure. Diffuser blades 104 and 105 may be integrally molded within base 102, or attached in a variety of ways well known in the art. In the embodiment of FIG. 1, braces 106 and 113 are added to improve the structural integrity of the diffuser blades 104 and 105, respectively.

As will be apparent to one skilled in the art, the base 102 may be effectively constructed in a variety of ways, provided that it can be inserted in the equipment shelf via edges 109 and 111 in a manner equivalent to the insertion of circuit boards in equipped positions. For example, the base 102 may simply be formed as a uniform member with rectangular dimensions equivalent to those of the circuit boards. As depicted in FIG. 1, the base includes ribs 101 to conserve material and add rigidity. In an alternate embodiment of the invention, material is selectively removed from some of the cells 113 within the ribs 101 to conserve additional material. Guide springs 112 are also formed within the base 102, and provide a mechanism for reducing vibration of the blank when inserted into an unequipped position.

Faceplate 108 is perpendicularly attached to the base 102, at a front edge 107 of base 102. As will be apparent to one skilled in the art, the faceplate 108 may be attached to the base 102 in a variety of ways. In the embodiment illustrated in FIG. 1, the faceplate 108 is integrally molded with the base 102, and incorporates braces 114 for added rigidity and strength.

In the embodiment of FIG. 1, faceplate 108 also includes spring latches 103, which provide means for securing blank 100 to the unoccupied position in the shelf. The latches 103 may be designed in a number of conventional ways. Faceplate 108 also includes one or more cable trays 110 that are used, for example, to retain optical cables ready for future interconnection with a circuit board that will replace blank 100 in the unequipped position.

As will be readily apparent to one skilled in the art, the components of blank 100 can be constructed from a variety of materials. For example, an injection molding process may be used to form the blank 100 from a variety of plastic resins. Acrylonitrile-Butadiene-Styrene (ABS) is one such resin providing reasonable strength at a low cost. Alternatively, materials such as Polycarbonate (PC) may provide improved impact strength at higher cost. Various blends of ABS and PC may be used to obtain a good balance between strength, cost and ease of manufacture. An example of such a blended material is General Electric's C6200 engineering plastic. The entire blank 100 may be molded integrally from such a material.

Figure 2A:
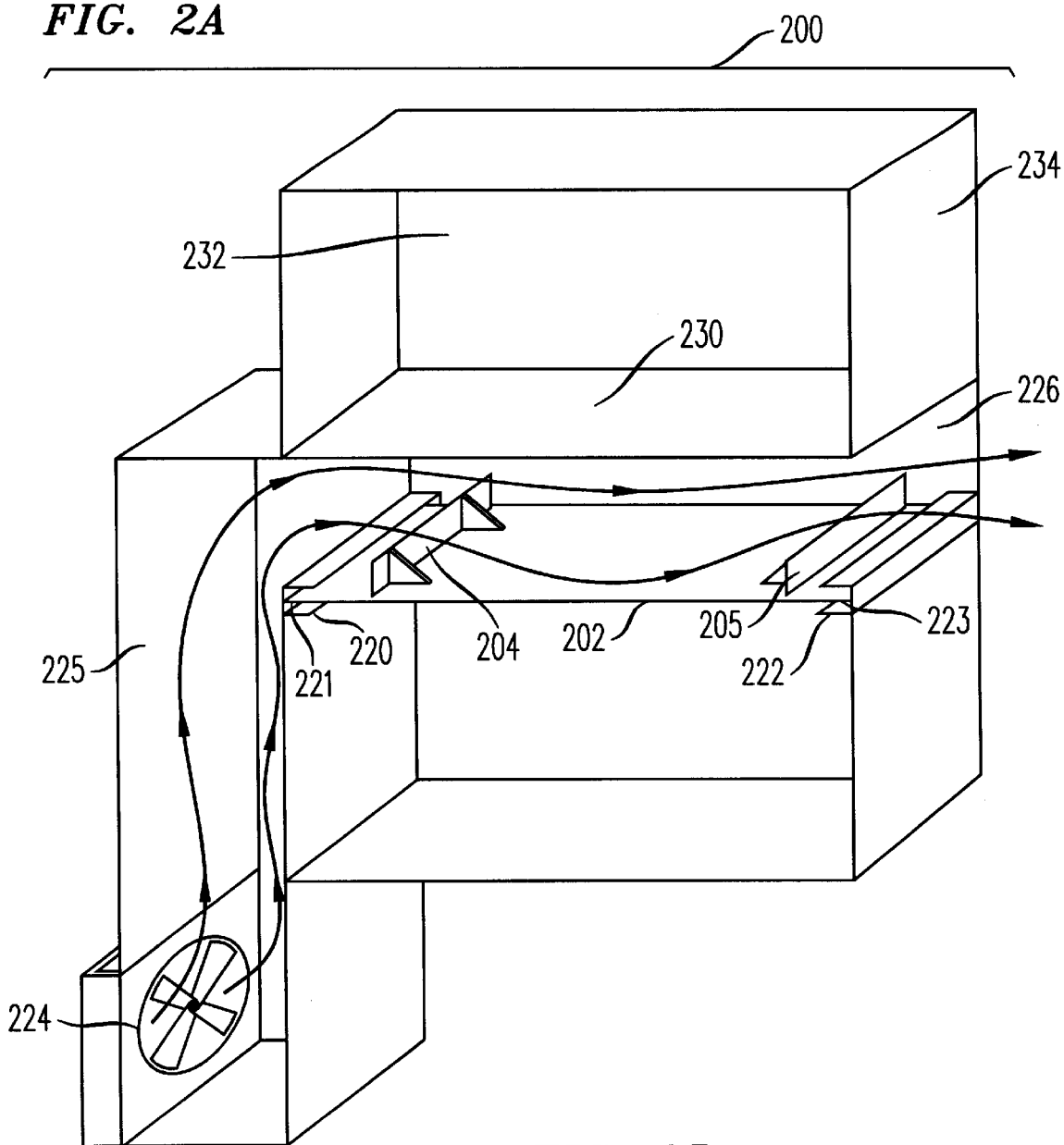
FIGS. 2A and 2B illustrate the positioning of the blank of FIG. 1 within an apparatus shelf, and diagram an airflow through this position.

FIG. 2A illustrates how blank 100 of FIG. 1 functions in an unequipped position in an apparatus shelf 200 to provide airflow backpressure through the position. In FIG. 2A, an upper edge 223 and a lower edge 221 of a base 202 locate a blank 202 in apparatus position guides 222, 220, respectively. Apparatus position guides 222, 220 are affixed to an apparatus shelf frame 232 by one of a variety of conventional methods. For example, apparatus position guides 222, 220 may be produced as an integral stamping in the associated frame surface 234.

A fan 224 promotes airflow in a fan plenum 225 interconnected to an apparatus position plenum 226. The apparatus position plenum 226 is effectively enclosed by the blank 202 and a next apparatus position surface 230 along a distance defined by the lower edge 221 and the upper edge 223. At or near the lower edge 221, a diffuser blade 204 meets the oncoming airflow driven by a fan 224.

Figure 2B:
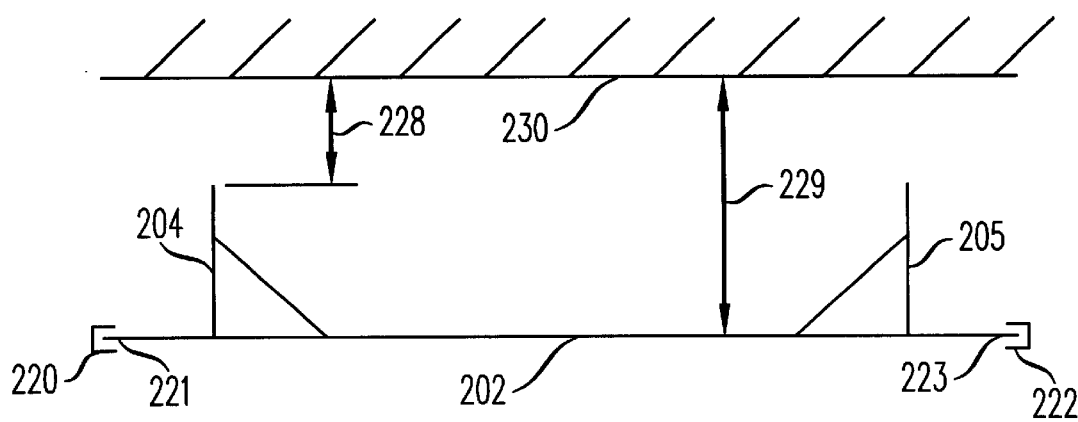

As shown in FIG. 2B, the diffuser blade 204 reduces the nominal plenum height 229 to an effective plenum height 228. Although this height is enlarged once the airflow passes diffuser blade 204, a second diffuser blade 205 located at or near the upper edge presents an additional barrier that again reduces the effective height at the exit from the plenum.

In a preferred embodiment of the invention, diffuser blades 204, 205 are designed to be about 0.950 inches high in an plenum that is nominally 1.575 inches high. As a result, the effective plenum height 228 is about 0.625 inches. With this configuration, at an air velocity of 400 feet per minute (fpm), a pressure drop of 0.40 inches of water ($in_{H2O}$) from the lower edge 221 to the upper edge 223 has been observed. At equipped positions experiencing similar air velocities, pressure drops of 0.2 $in_{H2O}$ to 0.5 $in_{H2O}$ have been observed.

Figure 3A:
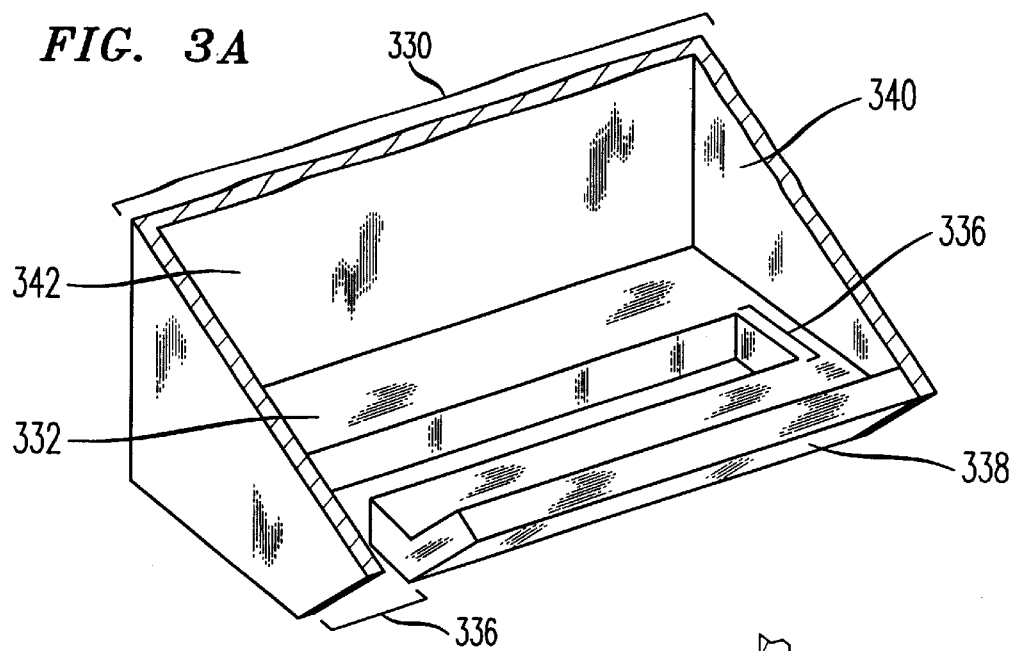
FIG. 3A shows the structure of the cable tray.

FIG. 3 further details the structure of an illustrative embodiment of the cable tray 110 of FIG. 1. Cable tray 330 includes a retention surface 332 that is designed to be of sufficient area, for example, to hold a connector at the end of an optical cable. A retention slot 336 perpendicularly pierces the surface 332, and is sufficiently wide to permit free passage of, for example, an optical cable having a cordage in the range of 1.6 to 3.0 millimeters. An entrance slot 334 of substantially similar width also perpendicularly pierces the surface 332 and the retention slot 336. When the cable tray 330 is affixed to the faceplate 108 of FIG. 1 so that the longitudinal axis of the retention slot 336 is parallel to the faceplate 108 and perpendicular to the base 102, the entrance slot 336 permits entry of the cable into the retention slot 336 from the front of the faceplate 108 via the entrance slot 334.

Walls 338, 340, 342 and 344 are perpendicularly provided at the edges of retention surface 332 so that retention surface 332 will continue to retain a cable connector when it is positioned non-horizontally. Because the entrance slot 334 is of sufficient width to pass a cable and not of sufficient width to pass a connector, the connector end of a cable to be retained must be lifted over the wall 338 both for entry into and removal from the cable tray 330.

Figure 3B:
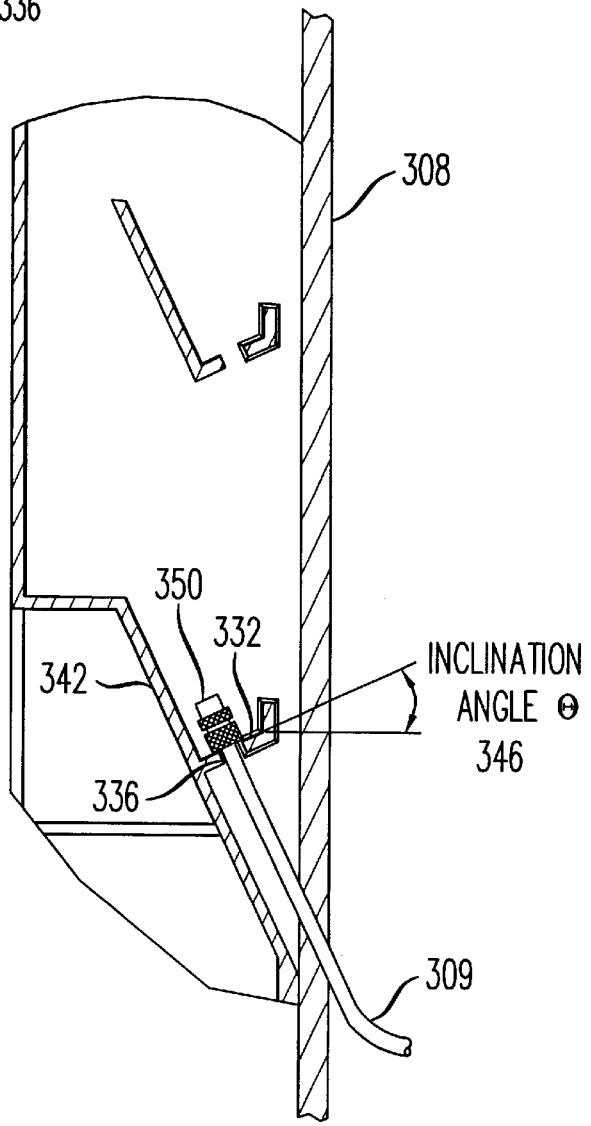
FIG. 3B illustrates the positioning of the cable tray with the faceplate.

FIG. 3B illustrates a cross-section of the cable tray 330 as attached to faceplate 308. In this embodiment, the retention surface 332 is positioned at an inclination angle Θ 346 with respect to a horizontal plane perpendicularly piercing faceplate 308. A cable connector 350 is retained by retention surface 332, with further support, for example, from wall 342. The positioning of retention surface 332 at inclination angle Θ 346 allows a cable 348 connected to cable connector 350 to be easily placed in retention slot 336 through faceplate 308, for example, without substantially bending cable 348.

FIGS. 4A and 4B illustrate the operation of springs 112 of FIG. 1. In FIG. 4A, base 402 is inserted into apparatus position guide 420 in order to be placed in an unequipped position. By sliding base 402 through guide 420, spring members 460 are compressed by guide walls 462, and thereby exert a frictional force against the walls 462 that assists in restraining base 402 within guide 420. As a result, vibrations in base 402 that would otherwise arise from the forced-air cooling and other forces are substantially reduced.

As shown in FIG. 4B, when base 402 is withdrawn from guide 420, spring members 460 return to an uncompressed position. The distance 466 across the spring extremities in an uncompressed state shown in FIG. 4B is greater than the distance 464 across these extremities as shown in FIG. 4A when the base 402 is inserted in the guide 420.

Figure 5A:
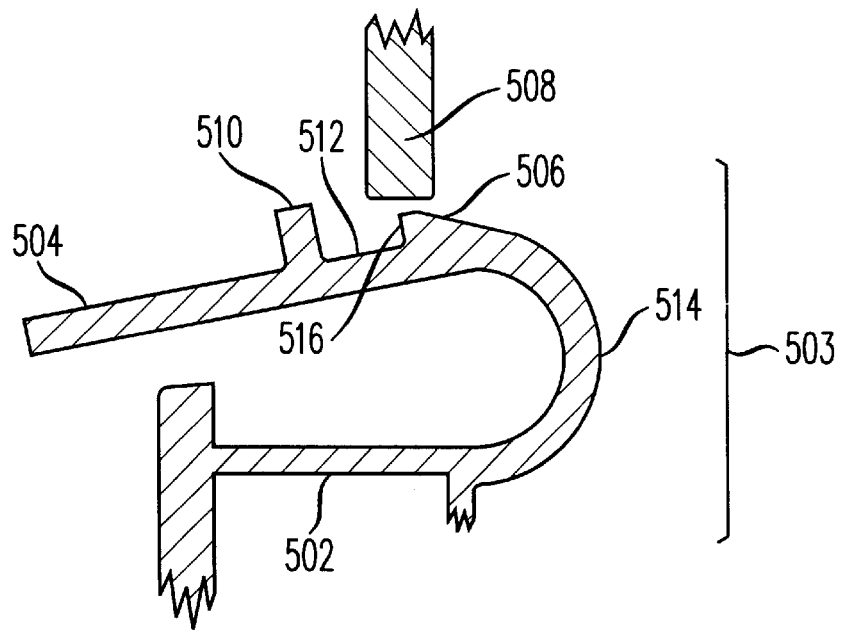
FIGS. 5A and 5B depict a spring mechanism as illustrated in the base of FIG. 1 for retaining the blank in position.
Figure 5B:
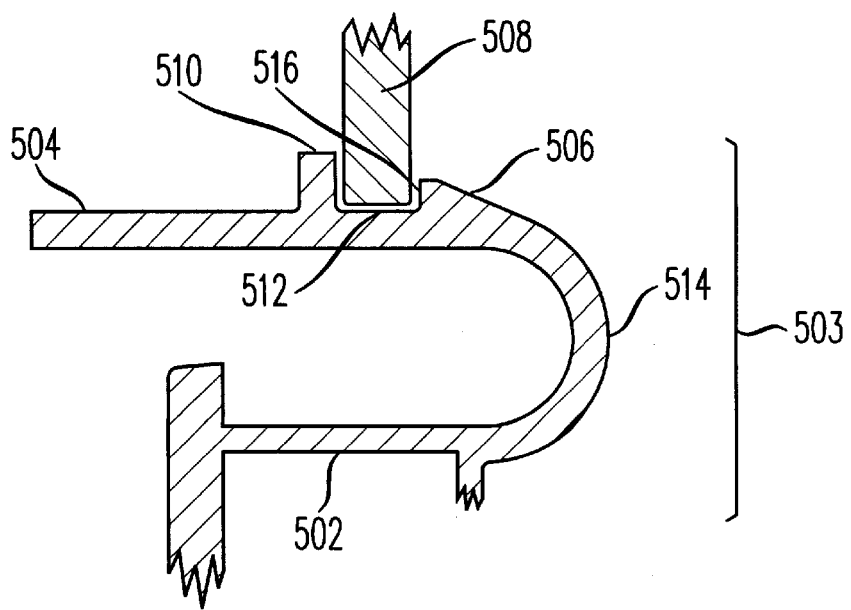

FIGS. 5A and 5B illustrate the operation of spring latches 103 of FIG. 1, used to retain the blank 100 in the unequipped position. In FIG. 5A, a spring latch 503 includes a spring member 514 attached to a fixed member 502 and an operating lever 504. The fixed member 502 positively attaches the spring latch 503 to the base 102 of FIG. 1. The spring member 504 can be compressed by moving the operating lever 504 towards the fixed member 502, thereby lowering a variable surface 506 so that retention tab 508 may pass horizontally over the variable surface 506. The retention tab 508 is positively attached to the equipment shelf near one of the apparatus position guides 222, 220 of FIG. 2A as an anchor for retaining the blank 100 of FIG. 1 in its unequipped position.

As an alternative to moving the operating lever 504, the retention tab 508 of FIG. 5A can be brought into direct contact with the variable surface 506. The height of the variable surface 506 increases gradually as it nears the latch stop 510. When the retention tab 508 makes contact with the variable surface 506 and moves horizontally toward the latch stop 510, the retention tab 508 exerts a force on the variable surface 506. This force causes the operating lever 504 to move toward the fixed member 502, so that the spring member 514 is compressed. As a result, the variable surface 506 becomes horizontally oriented, enabling the retention tab 508 to continue its horizontal movement until it reaches the latch stop 510.

FIG. 5B shows the spring latch 503 and retention tab 508 in position to enable the blank 100 of FIG. 1 to be retained. As the retention tab 508 passes over the variable surface 506, it aligns with a holding surface 512. Since the holding surface 512 is below the adjacent portion of the variable surface 506, the spring member 504 decompresses to bring the holding surface 512 into contact with the retention tab 508. Once in contact with the holding surface 512, the latch stop 510 and an intermediate surface 516 restrict the retention tab 508 from any further horizontal movement.

The exemplary embodiment of this method described above is but one of a number of alternative embodiments of the invention that will be apparent to those skilled in the art in view of the foregoing description. Accordingly, this description is to be construed as illustrative only, and is for the purpose of teaching those skilled in the art the best mode of carrying out the invention. Various other alternatives can be devised by a worker skilled in the art without departing from the teachings of this invention. For example, to provide the pressure-increasing function described above, the blank 100 of FIG. 1 could contain a single diffuser blade 104. Alternatively the blank 100 could incorporate a raised surface extending across a portion or all of the base 102 with a cross-sectional shape and area substantially similar to the shape and area of diffuser blade 104.

We claim:

1. A circuit pack blank for use in an unequipped position in an apparatus shelf, the blank comprising:
   a base for positioning the blank in the unequipped position; and
   a diffuser blade attached to and positioned on the base, said diffuser blade arranged to substantially reduce the effective cross-sectional area of an air plenum that is adjacent to and partially formed by the base when the blank is placed in the unequipped position.

2. The invention of claim 1, wherein said diffuser blade includes a largely planar surface, and is attached near a first edge of the base so that said planar surface is substantially perpendicular to a predominant direction of air flow through said air plenum when the blank is placed in the unequipped position.

3. The invention of claim 2, wherein the blank includes an additional diffuser blade with a largely planar surface, and is attached near a second edge of the base so that said additional planar surface is substantially perpendicular to the predominant direction of air flow through said plenum when the blank is placed in the unequipped position.

4. The invention of claim 1, wherein the base further includes means for limiting vibration in the blank once inserted in the unequipped position.

5. A circuit pack blank for use in an unequipped position in an apparatus shelf, the blank comprising:
   a base for positioning the blank in the unequipped position;
   a diffuser blade attached to and positioned on the base, said diffuser blade arranged to substantially reduce the effective cross-sectional area of an air plenum that is adjacent to and partially formed by the base when the blank is placed in the unequipped position; and
   a faceplate that includes a substantially planar member perpendicularly attached at an edge of the base, wherein the faceplate provides a means for inserting and removing the apparatus blank from the apparatus shelf.

6. The invention of claim 5, wherein the faceplate forms an additional portion of said air plenum when the blank is positioned in the unequipped position.

7. The invention of claim 5, wherein the faceplate further includes means for retaining the blank in the unequipped position.

8. The invention of claim 5, wherein the faceplate further includes a cable tray attached to the planar member of said faceplate, the cable tray having:
   a retention surface that is substantially flat and of sufficient area to support a connector that terminates a cable, and
   a retention slot perpendicularly piercing the retention surface along a substantial distance of a longitudinal axis through the retention surface, the retention slot being of sufficient width to allow the unobstructed passage of the cable through the retention slot while preventing the passage of said terminating connector through the retention slot.

9. The invention of claim 8, wherein the cable tray assembly further has an entrance slot that perpendicularly pierces the retention surface, is perpendicular to the retention slot, extends from the retention slot through an edge of the retention surface, and has a width substantially equivalent to the width of the retention slot.

10. The invention of claim 8, wherein the cable tray assembly further has a wall that is substantially perpendicular to the retention surface and is located along a portion of the retention surface edge that extends away from an opening to said entrance slot.

11. The invention of claim 10, wherein the cable tray assembly further has a wall at each remaining edge of the retention surface, each of said remaining walls being substantially perpendicular to the retention surface.

12. A shelf for housing electronic apparatus, the shelf comprising:
   a frame;
   an apparatus guide that is attached to the frame;
   a blank; the blank including
      a base, having an edge held by the apparatus guide to position the blank in an unequipped position of the shelf, and
      one or more diffuser blades attached to and positioned on the base;
   an air plenum adjacent to the blank and formed by said base and the frame; and the blank arranged in the frame so that said one or more diffuser blades substantially reduces the effective cross-sectional area of said air plenum.

13. The invention of claim 12, wherein the shelf further comprises an equipped apparatus position with an additional air plenum adjacent to said equipped apparatus position.

14. The invention of claim 13, wherein the shelf further comprises a fan and fan plenum, said fan plenum being connected to said air plenum and said additional air plenum and being capable of supporting an air flow of substantially uniform velocity such that back pressures at said air plenum and said additional air plenum are substantially equivalent.

15. The invention of claim 12, wherein the blank includes a means for retaining the blank in the frame.

16. The invention of claim 15, wherein the frame includes a retention tab adjacent to the apparatus guide which can be engaged by said retention means to retain the blank in the frame.

* * * * *